United States Patent [19]

Kobayashi et al.

[11] Patent Number: 4,855,256

[45] Date of Patent: Aug. 8, 1989

[54] METHOD OF MANUFACTURING MASKED SEMICONDUCTOR LASER

[75] Inventors: Hiroshi Kobayashi, 3-15 Hanakoganei, Kodaira-shi, Tokyo; Haruhiko Machida, 10-7 Nakaochiai 4-chome, Shinjuku-ku, Tokyo; Makoko Harigaya, Yokohama; Yasushi Ide; Jun Akedo, both of Tokyo, all of Japan

[73] Assignees: Ricoh Company, Ltd.; Hiroshi Kobayashi; Haruhiko Machida, Tokyo, Japan

[21] Appl. No.: 155,513

[22] Filed: Feb. 12, 1988

[30] Foreign Application Priority Data

Feb. 13, 1987 [JP] Japan .................... 62-30770

[51] Int. Cl.[4] ................ H01L 21/20; H01L 21/203
[52] U.S. Cl. ................. 437/129; 148/DIG. 72; 148/DIG. 94; 148/DIG. 169; 156/644; 372/49; 372/103; 427/53.1; 437/133; 437/173; 437/935; 437/936; 437/962; 437/984
[58] Field of Search ............ 156/DIG. 71, 65, 72, 156/81, 93, 94, 99, 102, 106, 169, ; 148/643, 644; 357/17, 18; 372/49, 103; 427/43.1, 53.1, 55; 437/126, 127, 129, 133, 173, 905, 935, 936, 962, 984

[56] References Cited

U.S. PATENT DOCUMENTS

| | | | |
|---|---|---|---|
| 3,849,738 | 11/1974 | Hakki | 372/49 |
| 3,866,238 | 2/1975 | Monroe | 372/49 |
| 4,001,719 | 1/1977 | Krupka | 357/18 |
| 4,100,508 | 7/1978 | Wittke | 357/18 |
| 4,178,564 | 12/1979 | Ladany et al. | 372/49 |
| 4,317,086 | 2/1982 | Scifres et al. | 357/17 |
| 4,337,443 | 6/1982 | Umeda et al. | 357/17 |
| 4,653,059 | 3/1987 | Akiba | 372/96 |
| 4,656,638 | 4/1987 | Tihanyi et al. | 372/49 |

FOREIGN PATENT DOCUMENTS

| | | | |
|---|---|---|---|
| 0090135 | 10/1983 | European Pat. Off. | 372/49 |
| 0089890 | 5/1983 | Japan | 437/129 |
| 0211292 | 11/1984 | Japan | 372/49 |
| 0009189 | 1/1985 | Japan | 372/49 |
| 0214578 | 10/1985 | Japan | 357/17 |
| 0140190 | 6/1986 | Japan | 372/49 |

OTHER PUBLICATIONS

Ettenberg, "A New Dielectric Facet Reflector for Semiconductor Lasers", Appl. Phys. Lett., vol. 32, No. 11, Jun. 1, 1978, pp. 724–725.

Primary Examiner—Brian E. Hearn
Assistant Examiner—William Bunch
Attorney, Agent, or Firm—Oblon, Spivak, McClelland, Maier & Neustadt

[57] ABSTRACT

A masking layer is formed on the light-emitting mirror surface of a semiconductor laser body. The masking layer is capable of blocking light emitted from the semiconductor laser body and of being thermally melted and evaporated by exposure to the emitted light. When the masking layer is formed on the light-emitting mirror surface of the semiconductor laser body, a small light-emitting hole is defined in the masking layer by the heat of the emitted light which is effective to prevent the material of the masking layer from being evaporated on a portion of the light-emitting surface.

9 Claims, 1 Drawing Sheet

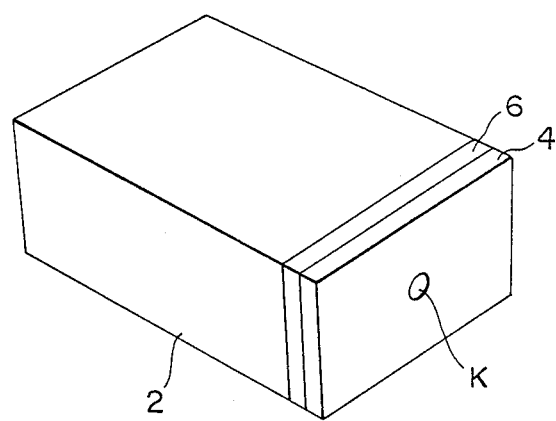

METHOD OF MANUFACTURING MASKED SEMICONDUCTOR LASER

BACKGROUND OF THE INVENTION

The present invention relates to a method of manufacturing a masked semiconductor laser that can be used as a light source for an optical memory, a magnetooptic memory, or the like.

Recording of information at high packing density has been made possible in recent years by optical memories and magnetooptic memories. Technical trends, however, are toward recording and reproducing of information at higher packing density. For reading recorded information from pits which are 0.4 to 0.5 micron across on an optical disk, it is necessary to reduce the diameter of a reading light beam to that range. With semiconductor lasers and imaging optical means which are presently available, however, it is highly difficult to reduce the diameter of an emitted laser beam to a range smaller than the wavelength of the laser beam, e.g., about 0.8 micron because of diffraction limitations.

SUMMARY OF THE INVENTION

It is an object of the present invention to provide a method of manufacturing a masked semiconductor laser serving as a light source for recording and reproducing information at high density, by forming a masking layer integral with the semiconductor laser and defining a minute hole in the masking layer to obtain a very small light-emitting spot.

According to the present invention, there is provided a method of manufacturing a masked semiconductor laser, comprising the steps of forming a masking layer capable of cutting off light emitted from a semiconductor laser body on a light-emitting surface of the semiconductor laser body, while energizing the semiconductor laser body, and simultaneously defining a light-emitting hole for the emitted light in a portion of the masking layer.

With the method of the present invention, a masked semiconductor laser with a minute light-emitting spot can easily be manufactured.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWING

The sole FIGURE is a perspective view of a masked semiconductor laser manufactured by the present invention.

DESCRIPTION

A semiconductor laser body which is to be processed in accordance with the present invention may be any one of various AlGaAs and GaInAsP semiconductor lasers represented by those which are capable of emitting light having wavelengths of 780 nm and 830 nm.

The material of a masking layer for blocking or cutting off light emitted by the semiconductor laser is required to prevent almost all of the emitted light from passing through, i.e., to reflect or absorb almost all of the emitted light. The masking layer material is also required to be thermally melted and evaporated by exposure to the light emitted by the semiconductor laser, for defining a light-emitting hole.

Examples of the masking layer material include metals such as Au, Ag, Cr, In, Al, and Zn and their compounds, amphoteric metals such as Se, Te, and Sn and their compounds, nonmetals such as carbon, Ge, and S, and organic materials such as phthalocyanine and cyanine dyes.

If the masking layer material used is not electrically insulative, then an electrically insulating layer such as of SiO, $SiO_2$, $Al_2S_3$, $Si_3N_4$, $MgF_2$, and $TiO_2$ should be disposed between the light-emitting mirror surface of the semiconductor laser and the masking layer material. The electrically insulative layer is required to be of a low enough refractive index not to impair laser oscillation, and be optically transparent so that the mirror surface will not be thermally destructed by light absorption.

The figure shows a masked semiconductor laser manufactured according to the present invention. The masked semiconductor laser includes a masking layer 4 and an electrically insulating or a dielectric layer layer 6 sandwiched between the masking layer 4 and a semiconductor laser body 2.

Experimental examples will be described below.

EXPERIMENTAL EXAMPLE 1:

A masked semiconductor laser constructed as shown was fabricated as follows:

A ternary-compound semiconductor laser of GaAs and AlGaAs (allowable light output: 5 mW, rated light output: 3 mW, and wavelength upon oscillation: 780 nm) was used as a semiconductor laser body 2. An SiO film was deposited as a dielectric layer 6 on the light-emitting cleavage surface of the semiconductor laser body 2 to a thickness of 2100 A by vacuum evaporation, under the following conditions:

Evaporation source material: SiO, purity 99,99%
Evaporation source temperature: 1200° C.
Evaporation source boat: molybdenum
Vacuum pressure: $2 \cdot 10^{-5}$ Torr
Temperature of the semiconductor laser body (substrate): 20°–42° C.

Then, while the semiconductor laser was being energized, a masking layer 4 of Sn was evaporated to a thickness of 3000 A on the dielectric layer 6 (SiO film) by resistance heating under the following conditions:

Evaporation source material: Sn, purity 99,99%
Evaporation source temperature: 500° C.
Evaporation source boat: molybdenum
Vacuum pressure: $2 \times 10^{-5}$ Torr
Temperature of the semiconductor laser body (substrate): 20°–42° C.
Semiconductor laser energizing current: 60 mA The surface of the masking layer of the masked semiconductor laser thus fabricated was observed by a scanning electron microscope. As a result, an opening as a light-emitting hole K was confirmed. The size of the opening was 1.2 microns $\times$ 1.6 microns. The magnification was 10,000 times.

EXPERIMENTAL EXAMPLE 2:

A masked semiconductor laser constructed as shown was fabricated as follows:

The same kind of semiconductor laser constructed as shown was fabricated as follows:

The same kind of semiconductor laser as that in EXPERIMENTAL EXAMPLE 1 was employed. An SiO film was deposited as a dielectric layer 6 on the light-emitting cleavage surface of the semiconductor laser body 2 to a thickness of 2100 A by vacuum evaporation, under the same conditions as those in EXPERIMENTAL EXAMPLE 1.

Then, while the semiconductor laser was being energized, a masking layer 4 of Zn was evaporated to a thickness of 3000 A on the dielectric layer 6 (SiO film) by resistance heating under the following conditions:
Evaporation source material: Zn, purity 99,99%
Evaporation source temperature: 700° C.
Evaporation source boat: molybdenum
Vacuum pressure: $2 \times 10^{-5}$ Torr
Temperature of the semiconductor laser body (substrate): 20°–42° C.
Semiconductor laser energizing current: 60 mA The surface of the masking layer of the masked semiconductor laser thus fabricated was observed by a scanning electron microscope. As a result, an opening as a light-emitting hole K was confirmed. The size of the opening was 0.9 micron $\times$ 1.2 microns. The magnification was 15,000 times.

EXPERIMENTAL EXAMPLE 3:

A masked semiconductor laser constructed as shown was fabricated as follows:

The same kind of semiconductor laser as that in EXPERIMENTAL EXAMPLES 1 and 2 was employed. An SiO film was deposited as a dielectric layer 6 on the light-emitting cleavage surface of the semiconductor laser body 2 to a thickness of 2100 A by vacuum evaporation, under the same conditions as those in EXPERIMENTAL EXAMPLES 1 and 2.

Then, while the semiconductor laser was being energized, a masking layer 4 of Al was evaporated to a thickness of 300 A on the dielectric layer 6 (SiO film) by resistance heating under the following conditions:
Evaporation source material: Al, purity 99,99%
Evaporation source temperature: 900° C.
Evaporation source boat: molybdenum
Vacuum pressure: $2 \times 10^{-5}$ Torr
Temperature of the semiconductor laser body (substrate): 20°–42° C.
Semiconductor laser energizing current: 60 mA The surface of the masking layer of the masked semiconductor laser thus fabricated was observed by a scanning electron microscope. As a result, an opening as a light-emitting hole K was confirmed. The size of the opening was 0.5 micron $\times$ 0.7 micron. The magnification was 15,000 times.

EXPERIMENTAL EXAMPLE 4:

A masked semiconductor laser constructed as shown was fabricated as follows:

The same find of semiconductor laser as that in EXPERIMENTAL EXAMPLES 1, 2, and 3 was employed. An SiO film was deposited as a dielectric layer 6 on the light-emitting cleavage surface of the semiconductor laser body 2 to a thickness of 2100 A by vacuum evaporation, under the same conditions as those in EXPERIMENTAL EXAMPLES 1, 2, and 3.

Then, while the semiconductor laser was being energized, a masking layer 4 of Ge was evaporated to a thickness of 5000 A on the dielectric layer 6 (SiO film) by resistance heating under the following conditions:
Evaporation source material: Ge, purity 99,99%
Evaporation source temperature: 1200° C.
Evaporation source boat: tantalum
Vacuum pressure: $2 \times 10^{-5}$ Torr
Temperature of the semiconductor laser body (substrate): 20°–42° C.
Semiconductor laser energizing current: 60 mA The surface of the masking layer of the masked semiconductor laser thus fabricated was observed by a scanning electron microscope. As a result, an opening as a light-emitting hole K was confirmed. The size of the opening was 0.6 micron $\times$ 0.7 micron. The magnification was 15,000 times.

As can be understood from EXPERIMENTAL EXAMPLES 1 —4 given above, when a masking layer for blocking or cutting off a laser beam emitted from a semiconductor laser body is formed on the light-emitting surface of the semiconductor laser body while the semiconductor laser body is being energized in a thin-film fabrication apparatus, the heat of the emitted laser beam is effective in preventing the masking layer material from being evaporated on a portion of the light-emitting surface, thus defining a minute light-emitting hole for the laser beam in the masking layer.

Although a certain preferred embodiment has been shown and described, it should be understood that many changes and modifications may be made therein without departing from the scope of the appended claims.

What is claimed is:

1. A method of manufacturing a masked semiconductor laser, comprising the steps of:
   forming a masking layer capable of cutting off light emitted from a semiconductor laser body on a light-emitting surface of the semiconductor laser body by means of a vacuum evaporation process; and
   simultaneously, while energizing the semiconductor laser body, defining a light-emitting hole in the depositing masking layer by the action of a beam of laser light emitted from the semiconductor, which beam prevents evaporation of masking material onto the body of the laser at the light-emitting hole.

2. The method of claim 1, wherein said masking layer is capable of cutting off or reflecting almost all of the light emitted from said semiconductor laser body but which is thermally melted and evaporated where laser light is emitted from the semiconductor laser body.

3. The method of claim 2, wherein said masking layer is formed from a material selected from the group consisting of metals, their compounds, amphoteric metals, their compounds and organic materials.

4. The method of claim 3, wherein said masking material is a metal selected from the group consisting of Au, Ag, Cr, In, Al and Zn.

5. The method of claim 3, wherein said masking material is an amphoteric metal selected from the group consisting of Se, Te and Sn.

6. The method of claim 3, wherein said masking material is a non-metal selected from the group consisting of carbon, Ge and sulfur.

7. The method of claim 3, wherein said organic masking material is a member selected from the group consisting of phthalocyanine and cyanine dyes.

8. The method of claim 1, wherein an electrically insulative layer of low refractive index and which is optically transparent is deposited between said masking layer and the light-emitting surface of said semiconductor laser body.

9. The method of claim 8, wherein the electrically insulating material of said insulative layer is SiO, $SiO_2$, $Al_2S_3$, $Si_3N_4$, $MgF_2$ or $TiO_2$.

* * * * *